(12) United States Patent
Hanna et al.

(10) Patent No.: US 9,418,830 B2
(45) Date of Patent: Aug. 16, 2016

(54) METHODS FOR BONDING SEMICONDUCTOR WAFERS

(71) Applicants: Jeffrey D. Hanna, Spicewood, TX (US); Robert F. Steimle, Austin, TX (US); Michael D. Turner, San Antonio, TX (US)

(72) Inventors: Jeffrey D. Hanna, Spicewood, TX (US); Robert F. Steimle, Austin, TX (US); Michael D. Turner, San Antonio, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 132 days.

(21) Appl. No.: 14/318,063

(22) Filed: Jun. 27, 2014

(65) Prior Publication Data

US 2015/0380235 A1 Dec. 31, 2015

(51) Int. Cl.
*H01L 21/02* (2006.01)
*B81C 1/00* (2006.01)

(52) U.S. Cl.
CPC ....... *H01L 21/02002* (2013.01); *B81C 1/00269* (2013.01); *H01L 2221/00* (2013.01)

(58) Field of Classification Search
CPC ................. B81C 1/00269; H01L 21/02002; H01L 2221/00
See application file for complete search history.

(56) References Cited

U.S. PATENT DOCUMENTS

| | | | |
|---|---|---|---|
| 6,500,760 B1 | 12/2002 | Peterson et al. | |
| 6,956,268 B2 | 10/2005 | Faris | |
| 7,081,657 B2 | 7/2006 | Faris | |
| 7,393,712 B2 | 7/2008 | Smith et al. | |
| 7,442,570 B2 | 10/2008 | Nasiri et al. | |
| 7,491,567 B2 | 2/2009 | DCamp et al. | |
| 7,948,034 B2 | 5/2011 | George et al. | |
| 8,058,143 B2 | 11/2011 | Montez et al. | |
| 8,084,332 B2 | 12/2011 | Nasiri et al. | |
| 8,633,049 B2 | 1/2014 | Nasiri et al. | |
| 2003/0217915 A1* | 11/2003 | Ouellet ................. | B22F 1/0051 204/192.15 |
| 2007/0295456 A1* | 12/2007 | Gudeman ........... | B81C 1/00269 156/379.7 |
| 2010/0068854 A1* | 3/2010 | Schirmer ............. | H01H 1/0036 438/125 |
| 2010/0283138 A1* | 11/2010 | Chen ................... | B81C 1/00269 257/678 |
| 2012/0319303 A1* | 12/2012 | Foster ................. | B81C 1/00269 257/787 |
| 2013/0020713 A1* | 1/2013 | Premachandran .. | H01L 21/6836 257/773 |
| 2015/0175407 A1* | 6/2015 | Cheng ................. | B81C 1/00246 257/415 |

* cited by examiner

Primary Examiner — Bac Au

(57) ABSTRACT

A method of bonding a cap wafer to a device wafer includes heating the device wafer and the cap wafer in the chamber, cooling the device wafer and the cap wafer in the chamber, pressurizing the chamber, introducing gas into the chamber while the chamber is pressurized to accelerate a rate of one of a group consisting of the heating and the cooling, and applying pressure to the device wafer and the cap wafer while a bond is formed between the device wafer and the cap wafer.

15 Claims, 3 Drawing Sheets

METHODS FOR BONDING SEMICONDUCTOR WAFERS

BACKGROUND

1. Field

This disclosure relates generally to semiconductor devices, and more specifically, to bonding semiconductors wafers to one another.

2. Related Art

Microelectromechanical systems (MEMS) are widely used in a variety of sensing applications. For example, a MEMS piezoresistive pressure sensor may be implemented on a semiconductor die to generate electrical signals indicative of the amount of pressure exerted on the semiconductor die (or a portion thereof). Some MEMS devices such as gyroscopes or resonators operate in a vacuum-sealed cavity. The stronger the vacuum level, the lower the power required to operate the MEMS device. With the continual demand to reduce power consumption, it is desirable to form vacuum levels that are as strong as possible.

Strong vacuum levels are more easily achieved and maintained if residual absorbed gases from the semiconductor wafers are removed before the vacuum seals are formed. Although the wafers can be baked to remove the residual absorbed gases before forming the vacuum seal, time required to bake the wafers increases costs and decreases wafer throughput. Alternatively, a material referred to as a "getter" can be used in the cavity to absorb the residual absorbed gases even after the cavity is vacuum sealed, but the getter material adds cost and complexity to wafer processing.

When baking is used to removed residual absorbed gases prior to vacuum bonding, a bottom wafer typically experiences poor thermal contact with a lower heater in the bonding equipment while the top wafer receives only radiant heating. Inability to effectively increase the temperature of the wafers increases the amount of time the wafers must be baked. Additionally, any difference in temperature between the top and bottom wafers can form mechanical stress on the bonded wafers. The stress can result in bowed wafers, which can present problems during subsequent processing and packaging, and decrease the yield.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of methods disclosed herein improve heat transfer of wafers during bonding by pressurizing the bond chamber to approximately one atmosphere (more or less) using an inert gas and/or a forming gas. Ramping the temperature up to bake temperature under atmospheric pressure and/or baking the wafer at atmospheric pressure out-gases the wafer more effectively than baking the wafer under vacuum alone. Additionally, transitioning the wafers below a eutectic or other specified temperature under atmospheric conditions results in a better temperature match between the wafers when they are brought into contact and bonded, thereby reducing mechanical stress between the subsequently bonded wafers. The methods disclosed solve the problem of producing a strong vacuum level for devices in the bonded wafers while reducing the time required to bake the wafers. Further, the temperature mismatch between wafers is reduced more rapidly by performing temperature transitions at atmospheric pressures before the wafers are bonded.

Figure 1:
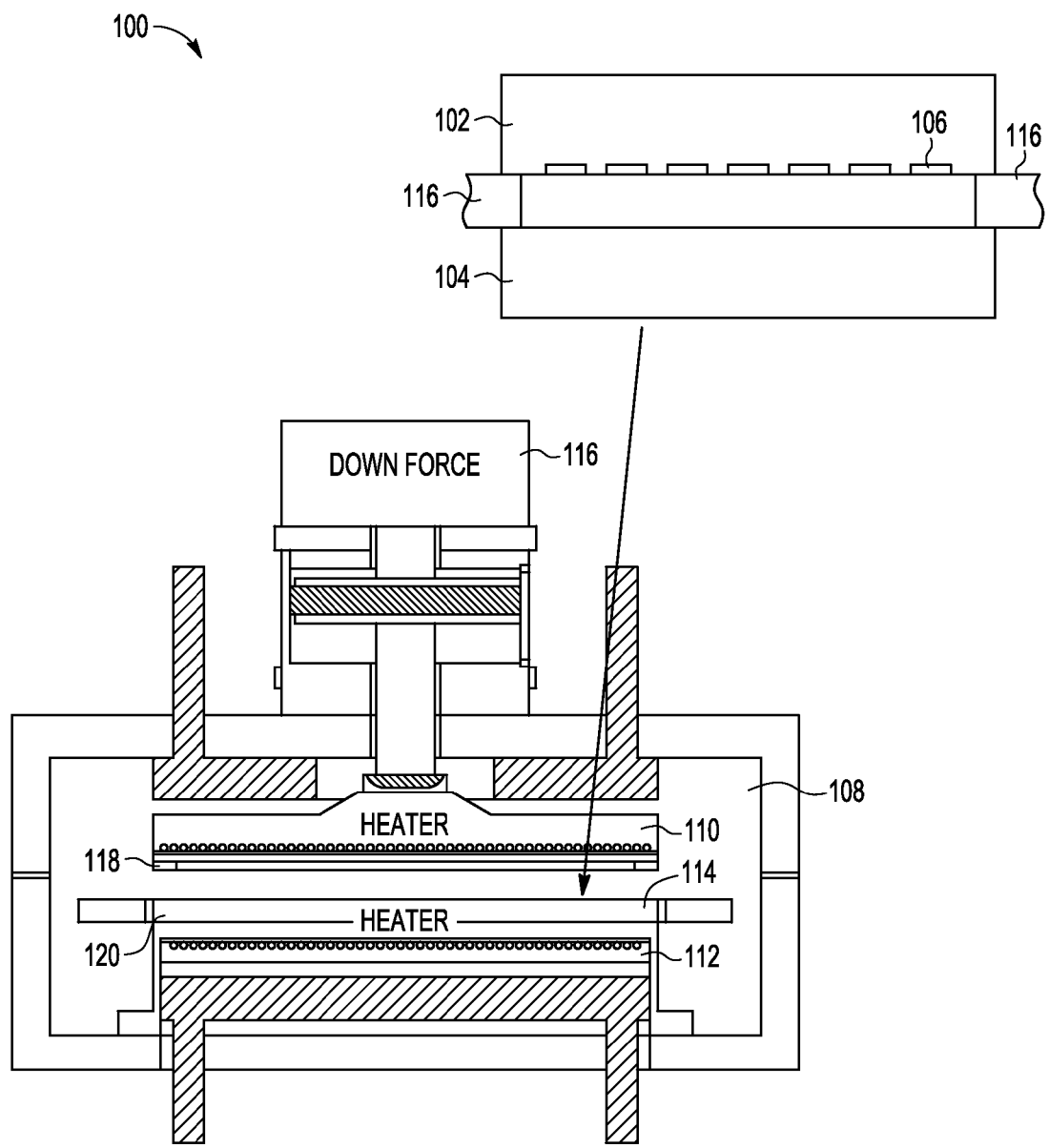
FIG. 1 illustrates an embodiment of equipment that can be used to bond wafers.

FIG. 1 illustrates an embodiment of bonding equipment 100 that can be used to bond wafers 102, 104. Wafer 102 can be referred to as a cap or cover wafer with a plurality of cavities 106, and wafer 104 can be referred to as a device or MEMS wafer 104. Cavities 106 are configured to form a vacuum-sealed enclosure around devices on wafer 104 when wafers 102, 104 are bonded together. The devices on wafer 104 can include gyroscopes, resonators and other devices that require a vacuum environment to operate.

The semiconductor wafers 102, 104 described herein can be made of any semiconductor material or combinations of materials, such as gallium arsenide, silicon germanium, silicon-on-insulator (SOI), silicon, monocrystalline silicon, the like, and combinations of the above. The semiconductor wafers can also include components to implement various types of electrical and electronic circuitry such as transistors, capacitors, resistors, inductors, along with one or more sensors that include membranes, seismic masses, proof masses, transducers, and/or other components. One or more interconnect layers can be formed on the substrate to connect various components to each other and to contact pads that enable a device to be electrically coupled to external devices. Some of the components on device wafer 104 may not require a vacuum to operate and therefore may be outside a respective cavity 106 after wafers 102, 104 are bonded. Unbonded wafers 102, 104 may be referred to herein as a wafer pair, a wafer couple, a coupled pair, and/or coupled wafers.

Bonding equipment 100 can include a bonding chamber 108, an upper heating element 110, a lower heating element 112, a chuck 114 for holding wafers 102, 104, and a device 116 for exerting force on upper pressure plate 118 against lower pressure plate 120 as the wafers 102, 104 are bonded. During initial stages of bonding, wafers 102, 104 can be separated from one another by spacers 116, which are removed in subsequent bonding stages.

Bonding equipment 100 can be capable of performing various types of bonding including eutectic, glass frit, anodic, and thermo-compression, among others. An example of bonding equipment 100 commercially available is a GEMINI® Automated Production Wafer Bonding System from EV Group, Inc. of St. Florian am Inn, Austria. Another example of commercially available bonding equipment 100 is a Model ABC/200 or CBC/200 Wafer Bonding Systems from SÜSS MicroTec Group of Garching, Germany.

Figure 2:
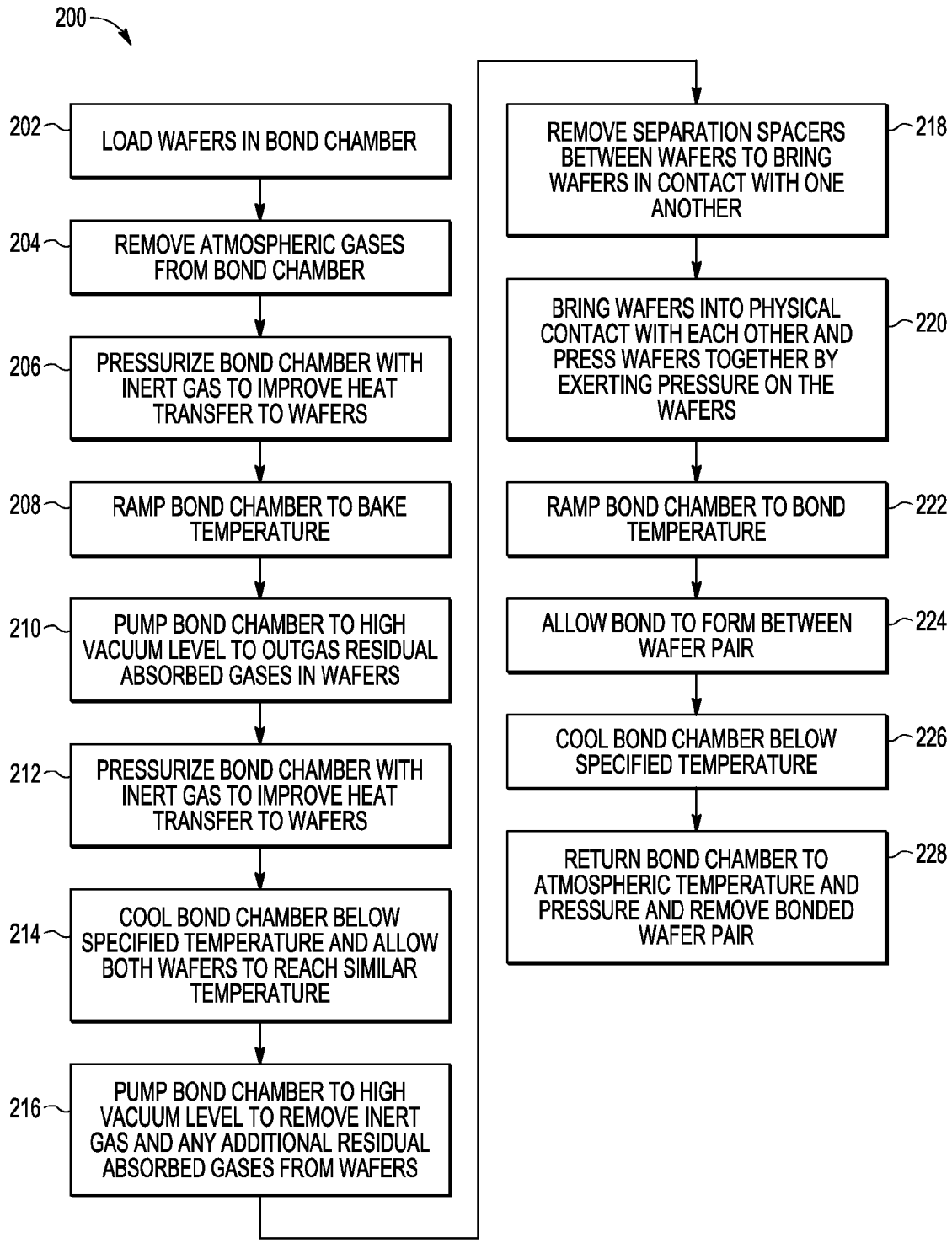
FIG. 2 is a flow diagram of an embodiment of a method for bonding two wafers using the equipment of FIG. 1.

Referring to FIGS. 1 and 2, FIG. 2 is a flow diagram of an embodiment of a method for bonding wafers 102, 104 to one another using the bonding equipment 100 of FIG. 1. Process 202 includes loading wafers 102, 104 in chuck 114 so that cavities 106 on wafer 102 are positioned over and aligned with respective devices requiring a vacuum seal on wafer 104. Spacers 116 are placed between a surface of wafer 102 that includes cavities 106 and a surface of wafer 104 that includes devices requires the vacuum seal. The spacers 116 maintain separation between wafers 102, 104 until it is time for wafers 102 104 to physically contact one another.

Process 204 includes removing atmospheric gases from bond chamber 108. The atmospheric gases are typically introduced when bond chamber 108 is opened to place wafers 102, 104 inside bond chamber 108. Once wafers 102, 104 are positioned in place, bonding chamber 108 is sealed and a pump (not shown) is used to remove atmospheric gases from bonding chamber 108.

Process 206 includes pressurizing bond chamber 108 with inert gas and/or a forming gas to improve heat transfer to wafers 102, 104. Inert gas can include helium, argon, nitrogen, or other gas that will not react with wafers 102, 104. The higher the pressure of bond chamber 108, the more benefit method 200 will achieve, however, a pressure of approximately one atmosphere or other suitable pressure can be used.

Process 208 includes ramping the temperature inside bond chamber 108 to a temperature used to bake wafers 102, 104 to out-gas residual absorbed gases. If residual absorbed gases such as argon are not out-gased during process 208, the residual absorbed gases can leak into the cavities after a vacuum seal is formed between wafers 102, 104 and affect the level of the vacuum. A device with a weak vacuum level can require more power to operate than a device with a strong vacuum level. Accordingly, it is desirable to remove as much of the residual absorbed gas as possible in process 208 before a vacuum seal is established between wafers 102, 104. The fact that bond chamber 108 is pressurized while wafers 102, 104 are baked helps both wafers 102, 104 to achieve a higher wafer temperature than would be possible if bond chamber 108 is not pressurized during the baking process. For example, if bond chamber 108 is not pressurized, wafers 102, 104 may have to bake for 2 or more hours at a wafer temperature that is lower than can be achieved with pressurization. In contrast, with bond chamber 108 pressurized, wafers 102, 104 may only have to bake for 40 minutes or less, with only 10 minutes of the bake time under high temperature in pressurized conditions, 20 minutes more at high temperature and then 10 minutes at a lower temperature. The required level of out-gassing can therefore be achieved in less than half the time when wafers 102, 104 are baked for at least a portion of the baking time in a pressurized bond chamber 108.

Process 210 includes pumping bond chamber 108 to a strong vacuum level and removing or evacuating the residual absorbed gases that were out-gassed from wafers 102, 104 during process 208. The vacuum level can be approximately 1e-4 millibars for approximately 20 minutes, or other suitable vacuum level and time period.

Once the residual absorbed gases are removed from bond chamber 108, process 212 includes again pressurizing bond chamber 108 with inert gas and/or a forming gas to improve heat transfer to wafers 102, 104. Inert gas can include helium, argon, nitrogen, or other gas that will not react with wafers 102, 104. The higher the pressure of bond chamber 108, the more benefit method 200 will achieve, however, a pressure of approximately one atmosphere or other suitable pressure can be used.

Process 214 includes cooling bond chamber 108 below a specified temperature and allowing both wafers 102, 104 to reach a similar temperature. When bond chamber 108 is not pressurized during the baking process, wafer 104 typically reaches a higher temperature than wafer 102. Even when allowed to cool before bonding, wafers 102 and 104 typically reach different temperatures after a given period of time. Since it is desirable to achieve high throughput of bonding equipment 100, cooling time is limited. When bond chamber 108 is pressurized, however, wafers 102 and 104 can more easily reach a similar temperature, thereby reducing or even eliminating mechanical stresses that occur when wafers 102, 104 are at different temperatures at the time wafers 102, 104 are bonded.

The specified cooling temperature may be determined by the type of bonding process being used. For example, if eutectic bonding is being used, the temperature at which the eutectic materials (for example, aluminum and germanium) freeze can be specified as the cooling temperature. For other types of bonding, such as thermocompression bonding, the cooling temperature may not be as significant as eutectic temperature, and therefore a default temperature can be used.

In some embodiments, wafers 102, 104 can be heated and cooled in a separate chamber (not shown) that is linked to the bond chamber 108 using a vacuum transfer chamber (not shown). The separate chamber, referred to as a degasification chamber, can control the vacuum level during heating and cooling of wafers 102, 104 in the same manner as the bond chamber 108. In addition the separate chamber may be capable of operating in batch mode during which more than one set of wafer pairs 102, 104 may go through the heating and cooling cycle. Bonding equipment 100 can include components that automatically transfer wafers 102, 104 between bond chamber 108 and the separate degasification chamber.

Process 216 includes pumping bond chamber 108 to a strong vacuum level and removing or evacuating the inert gas introduced in process 212 along with any residual absorbed gases that were out-gassed from wafers 102, 104 during process 214. The vacuum level can be approximately 1e-4 millibars for approximately 20 minutes, or other suitable vacuum level and time period.

Process 218 includes removing spacers 116 from between wafers 102 and 104 to bring the surface with cavities 106 of wafer 102 into physical contact and aligned with the surface having devices of wafer 104. In particular, cavities 106 are aligned to enclose corresponding devices on wafer 104.

Process 220 includes exerting force on wafers 102, 104 to facilitate a subsequent bonding process. In some cases, the bonding process may begin as soon as bonding material on wafer 102 and/or wafer 104 comes into contact with bonding material or the surface of the other wafer. In other cases, the bonding process may not begin until the temperature of wafers 102, 104 is raised or lowered. Accordingly, process 222 includes ramping the temperature of bond chamber 108 to a specified bond temperature.

For example, to perform eutectic bonding, the specified bond temperature will depend on the type of bonding materials being used, as shown in Table 1 below:

TABLE 1

| Bonding Temperatures of Various Eutectic Materials | |
|---|---|
| Eutectic Material | Temp ° C. |
| 5Ag-95Cd | 340 |
| 75Au-25Sb | 356 |
| 88Au-12Ge | 361 |
| 97Au-3Si | 363 |
| 6Al-94Zn | 381 |
| 48Al-52Ge | 424 |
| 36Al-37Mg | 450 |
| 75Pb-25Pd | 454 |
| 56Ag-44Sb | 485 |
| 58Au-42In | 495 |
| 68Al-27Cu-5Si | 524 |
| 23Ag--53Cd-24Cu | 525 |
| 24Cu-76Sb | 526 |
| 62Cd-38Cu | 549 |

Whether or not a change in temperature is required to reach a specified bonding temperature in process 222, process 224 includes maintaining pressure force on wafers 102, 104 while allowing the bond to form between wafers 102, 104. The amount of time and pressure force required can be selected based on the bonding process being used.

If temperature was changed to level where handling wafers 102, 104 would be difficult or likely to cause problems with the bond, process 226 includes allowing the temperature to return to a specified level before attempting to move wafers 102, 104 from bond chamber 108. For example, with eutectic bonding, process 226 includes allowing the temperature to reach a level below the eutectic temperature before removing wafers 102, 104 from bond chamber 108.

Figure 3:
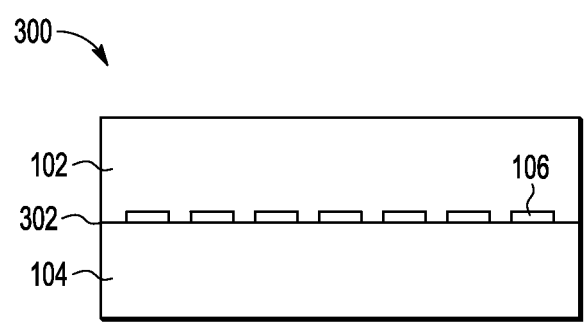
FIG. 3 illustrates an embodiment of a bonded wafer pair formed using the method of FIG. 2.

Referring to FIGS. 1, 2 and 3, once a desired or specified temperature has been reached in chamber 108 for a specified amount of time, process 228 includes returning bond chamber 108 to atmospheric temperature and pressure and removing the wafer pair 300 from bond chamber 108 with bond 302 between wafers 102 and 104.

By now it should be appreciated that pressurizing bond chamber 108 with an inert or forming gas while increasing or decreasing temperature of the wafers 102, 104 helps wafers 102, 104 reach a desired temperature more quickly. Reaching a desired baked temperature allows more of the residual absorbed gases to be removed from the wafers 102, 104 before bonding, thereby improving the level of vacuum that can be maintained around the devices. Additionally, having both wafers 102, 104 at a similar temperature during and after the bonding process reduces mechanical stresses that may otherwise form as the wafers 102, 104 cool down from different temperatures.

In some embodiments, a method of bonding (200) a cap wafer (102) to a device wafer (104) includes heating the device wafer and the cap wafer in the chamber (208), cooling the device wafer and the cap wafer in the chamber, pressurizing the chamber by introducing gas into the chamber (206, 212) to accelerate a rate of one of a group consisting of the heating and the cooling, and applying pressure (220) to the device wafer and the cap wafer while a bond is formed (224) between the device wafer and the cap wafer.

In another aspect, the heating can cause outgassing (212) from the cap wafer and the device wafer.

In another aspect, the heating can cause the cap wafer and the device wafer to exceed a eutectic temperature.

In another aspect, the cooling causes the cap wafer and the device wafer to drop below the eutectic temperature.

In another aspect, the pressurizing by introducing gas into the chamber accelerates the heating and the cooling.

In another aspect, the method can further comprise establishing a strong vacuum level in the chamber to remove the gas and residual absorbed gases.

In another aspect, the introducing gas into the chamber comprises introducing an inert gas.

In another aspect, the method can further comprise establishing a vacuum in the chamber; and before the applying pressure to the device wafer and the cap wafer, positioning a surface of the cap wafer including a plurality of cavities in alignment with a surface of the device wafer that includes a corresponding plurality of devices, wherein each of the cavities encloses a respective one of the devices and the cavities are vacuum-sealed after the bond if formed.

In another aspect, the method can further comprise, after the positioning, changing a temperature in the bond chamber to a bond temperature while the pressure is applied to the device wafer and the cap wafer.

In another aspect, the gas comprises one of a group consisting of argon, helium, forming gas, and nitrogen.

In another aspect, the method can further comprise, after the cooling, raising a temperature of the chamber to enhance forming the bond, wherein the bond is a eutectic bond.

In another aspect, the method can further comprise clamping the cap wafer and the device wafer together while separating the cap wafer and the device wafer with a plurality of spacers.

In another aspect, the method can further comprise, prior to the applying pressure, removing the spacers (116, 218).

In other embodiments, a method of bonding a wafer pair including a cap wafer (102) and a device wafer (104), can comprise providing the wafer pair in a chamber (108), pressurizing (206, 208) the chamber a first time by introducing a gas into the chamber to increase rate of change of a temperature of the wafer pair and to outgas residual absorbed gases from the wafer pair, evacuating (210) the chamber to remove the residual absorbed gases after pressurizing the chamber the first time, pressurizing (212) the chamber a second time by introducing a gas into the chamber to increase a rate of change of the temperature of the wafer pair, evacuating (216) the chamber of the gas and the residual absorbed gases after pressurizing the chamber the second time, pressing (220) the cap wafer and the device wafer together, and bonding (222, 224) the cap wafer and device wafer together.

In another aspect, the bonding the cap wafer and the device wafer comprises heating the cap wafer and the device wafer to exceed a eutectic melting temperature (208).

In another aspect, pressurizing the chamber the second time is further characterized as reducing a temperature differential between the cap wafer and the device wafer.

In another aspect, pressurizing the chamber the first and second time is characterized by introducing a gas comprises introducing at least one of a group consisting of nitrogen, helium, argon, and forming gas into the chamber.

In still other embodiments, a method of bonding, in a chamber, a cap wafer that is paired with a device wafer spaced apart by a plurality of spacers, can comprise pressurizing the chamber and heating (206, 208) the chamber to induce outgassing from the cap wafer and the device wafer, evacuating (210) the chamber to remove residual absorbed gases resulting from the outgassing, pressurizing the chamber and cooling the cap wafer and the device wafer (212, 214), removing the plurality of spacers (218), and forming a bond between the cap wafer and the device wafer (224).

In another aspect, the cooling the cap wafer and the device wafer is further characterized by the pressurizing the chamber causing a temperature differential between the cap wafer and the device wafer to be reduced.

In another aspect, the pressurizing the chamber to induce outgassing comprises introducing, into the chamber, a gas comprising one of group consisting of nitrogen, argon, helium, and forming gas.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of bonding, in a chamber, a cap wafer to a device wafer, comprising:
   heating the device wafer and the cap wafer in the chamber;
   cooling the device wafer and the cap wafer in the chamber;
   pressurizing the chamber by introducing gas into the chamber to accelerate a rate of one of a group consisting of the heating and the cooling;
   applying pressure to the device wafer and the cap wafer while a bond is formed between the device wafer and the cap wafer, and
   after the cooling, raising a temperature of the chamber to enhance forming the bond, wherein the bond is a eutectic bond.

2. The method of claim 1, wherein:
   the heating causes outgassing from the cap wafer and the device wafer.

3. The method of claim 2, wherein:
   the heating causes the cap wafer and the device wafer to exceed a eutectic temperature.

4. The method of claim 3, wherein:
   the cooling causes the cap wafer and the device wafer to drop below the eutectic temperature.

5. The method of claim 1, wherein:
   the pressurizing by introducing gas into the chamber accelerates the heating and the cooling.

6. The method of claim 1, further comprising:
   establishing a strong vacuum level in the chamber to remove the gas and residual absorbed gases.

7. The method of claim 6, further comprising:
   establishing a vacuum in the chamber; and
   before the applying pressure to the device wafer and the cap wafer, positioning a surface of the cap wafer including a plurality of cavities in alignment with a surface of the device wafer that includes a corresponding plurality of devices, wherein each of the cavities encloses a respective one of the devices and the cavities are vacuum-sealed after the bond if formed.

8. The method of claim 7, further comprising:
   after the positioning, changing a temperature in the bond chamber to a bond temperature while the pressure is applied to the device wafer and the cap wafer.

9. The method of claim 1, wherein:
   the introducing gas into the chamber comprises introducing an inert gas.

10. The method of claim 1, wherein:
    the gas comprises one of a group consisting of argon, helium, forming gas, and nitrogen.

11. The method of claim 1, further comprising:
    clamping the cap wafer and the device wafer together while separating the cap wafer and the device wafer with a plurality of spacers.

12. The method of claim 11, further comprising, prior to the applying pressure, removing the spacers.

13. A method of bonding, in a chamber, a cap wafer that is paired with a device wafer spaced apart by a plurality of spacers, comprising:
    pressurizing the chamber and heating the chamber to induce outgassing from the cap wafer and the device wafer;
    evacuating the chamber to remove residual absorbed gases resulting from the outgassing;
    pressurizing the chamber and cooling the cap wafer and the device wafer;
    removing the plurality of spacers; and
    forming a bond between the cap wafer and the device wafer.

14. The method of claim 13, wherein:
    the cooling the cap wafer and the device wafer is further characterized by the pressurizing the chamber causing a temperature differential between the cap wafer and the device wafer to be reduced.

15. The method of claim 14, wherein:
    the pressurizing the chamber to induce outgassing comprises introducing, into the chamber, a gas comprising one of group consisting of nitrogen, argon, helium, and forming gas.

* * * * *